(12) United States Patent
Samardzija et al.

(10) Patent No.: US 11,417,953 B2
(45) Date of Patent: Aug. 16, 2022

(54) ELECTRONIC SHIELDING OF ANTENNAS FROM FAN CONTROLS IN A COMPACT ELECTRONIC DEVICE

(71) Applicant: Plume Design, Inc., Palo Alto, CA (US)

(72) Inventors: Miroslav Samardzija, Mountain View, CA (US); Chien Chang Chen, New Taipei (TW); Ming-Tsung Su, Palo Alto, CA (US); Brian Nam, San Jose, CA (US); Liem Hieu Dinh Vo, San Jose, CA (US); William McFarland, Portola Valley, CA (US)

(73) Assignee: Plume Design, Inc., Palo Alto, CA (US)

( * ) Notice: Subject to any disclaimer, the term of this patent is extended or adjusted under 35 U.S.C. 154(b) by 272 days.

(21) Appl. No.: 16/683,526

(22) Filed: Nov. 14, 2019

(65) Prior Publication Data
US 2021/0151875 A1 May 20, 2021

(51) Int. Cl.
| | |
|---|---|
| *H05K 7/20* | (2006.01) |
| *H01Q 1/52* | (2006.01) |
| *H05K 1/14* | (2006.01) |
| *H05K 1/02* | (2006.01) |
| *H04W 88/08* | (2009.01) |
| *H01Q 1/22* | (2006.01) |
| *H01R 12/71* | (2011.01) |

(52) U.S. Cl.
CPC ........... *H01Q 1/526* (2013.01); *H01Q 1/2291* (2013.01); *H01R 12/716* (2013.01); *H04W 88/08* (2013.01); *H05K 1/0224* (2013.01); *H05K 1/144* (2013.01); *H05K 7/20172* (2013.01); *H05K 7/20409* (2013.01); *H05K 2201/042* (2013.01); *H05K 2201/093* (2013.01); *H05K 2201/098* (2013.01); *H05K 2201/10098* (2013.01)

(58) Field of Classification Search
CPC .... H05K 1/144; H05K 7/202; H05K 7/20172; H05K 7/20209; H05K 9/022; H05K 9/0024; H05K 9/0039; H05K 2201/10371; H05K 2201/10515
See application file for complete search history.

(56) References Cited

U.S. PATENT DOCUMENTS

| | | |
|---|---|---|
| 6,853,197 B1 | 2/2005 | McFarland et al. |
| 6,961,545 B2 | 11/2005 | Tehrani et al. |

(Continued)

FOREIGN PATENT DOCUMENTS

| | | | | |
|---|---|---|---|---|
| JP | S63140697 U | * 9/1988 | ............... | H01R 4/64 |
| JP | H09283957 A | * 10/1997 | ............... | H05K 1/18 |

(Continued)

*Primary Examiner* — Paresh Paghadal
(74) *Attorney, Agent, or Firm* — Clements Bernard Baratta; Lawrence A. Baratta, Jr.

(57) ABSTRACT

A compact electronic device for wireless communication is disclosed. The compact electronic device includes a main printed circuit board, one or more antennas, at least one conductor, and a shell. The one or more antennas are configured for wireless communication. The at least one conductor being configured to provide at least one of control signals and power to a fan. The shell mounts the fan relative to the main printed circuit board. The shell includes walls forming a cavity. The walls encapsulate the conductor in the cavity.

18 Claims, 9 Drawing Sheets

(56) References Cited

U.S. PATENT DOCUMENTS

| | | |
|---|---|---|
| 7,245,882 B1 | 7/2007 | McFarland |
| 7,245,893 B1 | 7/2007 | Husted et al. |
| 7,251,459 B2 | 7/2007 | McFarland et al. |
| 9,136,937 B1 | 9/2015 | Cheng et al. |
| 9,160,584 B1 | 10/2015 | Kavousian et al. |
| 2005/0061477 A1* | 3/2005 | Mira ............... H01L 23/467 165/80.3 |
| 2006/0148284 A1* | 7/2006 | Che ................. H05K 1/141 439/76.1 |
| 2012/0113585 A1* | 5/2012 | Stanley ............. F03D 3/06 416/175 |
| 2013/0010427 A1* | 1/2013 | Lin .................. G06F 1/203 361/697 |
| 2013/0016484 A1* | 1/2013 | Yoo ................. H04B 1/3833 361/752 |
| 2013/0090057 A1 | 4/2013 | Green et al. |
| 2013/0155609 A1* | 6/2013 | Kuo ................. G06F 1/20 361/679.48 |
| 2013/0293424 A1 | 11/2013 | Zhu et al. |
| 2014/0009344 A1 | 1/2014 | Zhu et al. |
| 2014/0009355 A1 | 1/2014 | Samardzija et al. |
| 2014/0112511 A1 | 4/2014 | Corbin et al. |
| 2014/0168908 A1* | 6/2014 | Chuang ............. H05K 1/0218 361/735 |
| 2014/0226572 A1 | 8/2014 | Thota et al. |
| 2014/0340265 A1 | 11/2014 | Vazquez et al. |
| 2015/0099474 A1 | 4/2015 | Yarga et al. |
| 2015/0109167 A1 | 4/2015 | Yarga et al. |
| 2015/0195836 A1 | 7/2015 | Malkin et al. |
| 2015/0302976 A1 | 10/2015 | Chang et al. |
| 2015/0303568 A1 | 10/2015 | Yarga et al. |
| 2015/0311960 A1 | 10/2015 | Samardzija et al. |
| 2016/0056526 A1 | 2/2016 | Li et al. |
| 2016/0336643 A1 | 11/2016 | Pascolini et al. |
| 2017/0163129 A1* | 6/2017 | Tramet ............. H02K 11/33 |
| 2018/0298920 A1* | 10/2018 | Hino ............... F04D 29/5813 |
| 2019/0021184 A1* | 1/2019 | Williams .......... G06F 1/18 |
| 2022/0015586 A1* | 1/2022 | Pan ................. A61L 2/10 |

FOREIGN PATENT DOCUMENTS

| | | | |
|---|---|---|---|
| JP | H0317698 U | * 11/1997 | ............ H05K 1/18 |
| JP | 2013207161 A | * 10/2013 | ............ H05K 9/00 |
| WO | WO-2020228700 A1 | * 11/2020 | ............ G01L 1/2262 |

* cited by examiner

ELECTRONIC SHIELDING OF ANTENNAS FROM FAN CONTROLS IN A COMPACT ELECTRONIC DEVICE

FIELD OF THE DISCLOSURE

The present disclosure generally relates to a wireless networking device. More particularly, the present disclosure relates to systems and methods for electrically shielding antennas of a compact electronic device, such as a wireless access point, from interference caused by electrical conductors for the fan of the compact electronic device.

BACKGROUND OF THE DISCLOSURE

Wireless networks, such as Wi-Fi networks (i.e., Wireless Local Area Networks (WLAN) based on the IEEE 802.11 standards), have become ubiquitous. People use them in their homes, at work, and in public spaces such as schools, cafes, even parks. Wireless networks provide great convenience by eliminating wires and allowing for mobility. The applications that consumers run over wireless networks is continually expanding. Today people use wireless networks, and in particular Wi-Fi, to carry all sorts of media, including video traffic, audio traffic, telephone calls, video conferencing, online gaming, and security camera video. Often traditional data services are simultaneously in use, such as web browsing, file upload/download, disk drive backups, and any number of mobile device applications. In fact, Wi-Fi has become the primary connection between user devices and the Internet in the home or other locations. The vast majority of connected devices use Wi-Fi for their primary network connectivity. As such, Wi-Fi access devices, namely Wi-Fi Access Points (APs) are deployed in a distributed fashion in a location (home, office, etc.).

The trend in consumer electronics design and the like is for aesthetically pleasing hardware form factors in a small and compact manner. For example, a distributed Wi-Fi system includes a number of Wi-Fi APs distributed around a location such as a residence. However, placing a number of APs around a house puts additional pressure on making the APs small, attractive (e.g., unique industrial design). Such small APs or other electronic devices, with an appealing, compact industrial design, raise significant issues with respect to signal interference due to the close proximity of the various components, such as electrical conductors and the antennas.

BRIEF SUMMARY OF THE DISCLOSURE

In an embodiment, a compact electronic device for wireless communication includes a main printed circuit board, one or more antennas, at least one conductor, and a shell. The one or more antennas are configured for wireless communication. The at least one conductor being configured to provide at least one of control signals and power to a fan. The shell mounts the fan relative to the main printed circuit board. The shell includes walls forming a cavity. The walls encapsulate the conductor in the cavity.

The compact electronic device can further include a fan printed circuit board. A portion of the fan printed circuit board can be configured to extend outside of a radial extent of the fan, and a connection between the conductor and the fan printed circuit board can be encapsulated in the cavity.

The fan printed circuit board can further include a metallic plating electrically connected to a ground plane of the fan printed circuit board. The metallic plating can form a contiguous ring around the fan printed circuit board connector. The contiguous ring can contact a mating surface of the walls to shield the one or more antennas from the conductor and the fan printed circuit board connector. The metallic plating can be a corrosion resistant high connectivity malleable material. The metallic plating can also be a conductive gasket positioned between the fan printed circuit board and the shell The main printed circuit board can include ground tracks forming a contiguous ring around the conductor at a connection of the conductor to the main printed circuit board. The ground tracks can contact a bottom of the shell to shield the one or more antennas from the conductor and the fan printed circuit board connector.

The walls can be electrically connected to a ground on the fan printed circuit board and to a ground on the main printed circuit board. The walls can include a metallic material.

Fan connection traces in the fan printed circuit board can be shielded by a ground plane at a back of the fan printed circuit board, and the fan connection traces in the fan printed circuit board and in the main printed circuit board are each positioned between ground planes within the fan printed circuit board and the main printed circuit board respectively.

The shell can include a heat sink, and the cavity can adjoin fins of the heat sink. The walls can form a contiguous ring around the conductor.

The conductor comprises a main printed circuit board connector fixed to the main printed circuit board, and the conductor is configured to mate with the fan printed circuit board connector, and an interface between the fan printed circuit board connector and the conductor can include one or more pins mated with one or more receptacles that form an electrical connection The conductor can include one or more wires encapsulated within the cavity. The cavity can be sized to receive slack in the one or more wires required for assembly of the compact electronic device. The wires can connect to the main printed circuit board via a connector, and the connector can be encompassed in the cavity and be surrounded by the walls.

The compact electronic device can further include a fan carrier that holds the fan in place relative to the shell. The fan carrier can cover a back of the fan printed circuit board to shield fan connection traces in the fan printed circuit board and to shield the cavity. The connector is surrounded by a contiguous ring of ground on the main printed circuit board which contacts the shell.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

In various embodiments, the present disclosure relates to systems and methods for a compact electronic device, such as an access point, for wireless communication. The compact electronic device can be compact with one or more conductors that electrically connect printed circuit boards (PCBs) proximate to one or more of the antennas of the device. The one or more conductors can transfer control signals and power between the PCBs. The one or more conductors are encapsulated in a cavity formed by walls in a mounting shell that is configured to mount components of the electronic device, such as a fan for cooling the device.

As will be described in greater detail below, the walls can be connected to a ground of each of the PCBs in such a manner as to shield the antennas from the one or more conductors by preventing or reducing any electrical interference caused by electric fields and currents of the conductors. The walls and PCBs can be configured to form a Faraday cage around the one or more conductors to effectuate this shielding. By shielding the antennas from the one or more conductors, the efficiency and receive sensitivity of the antennas can be improved.

Figure 1:
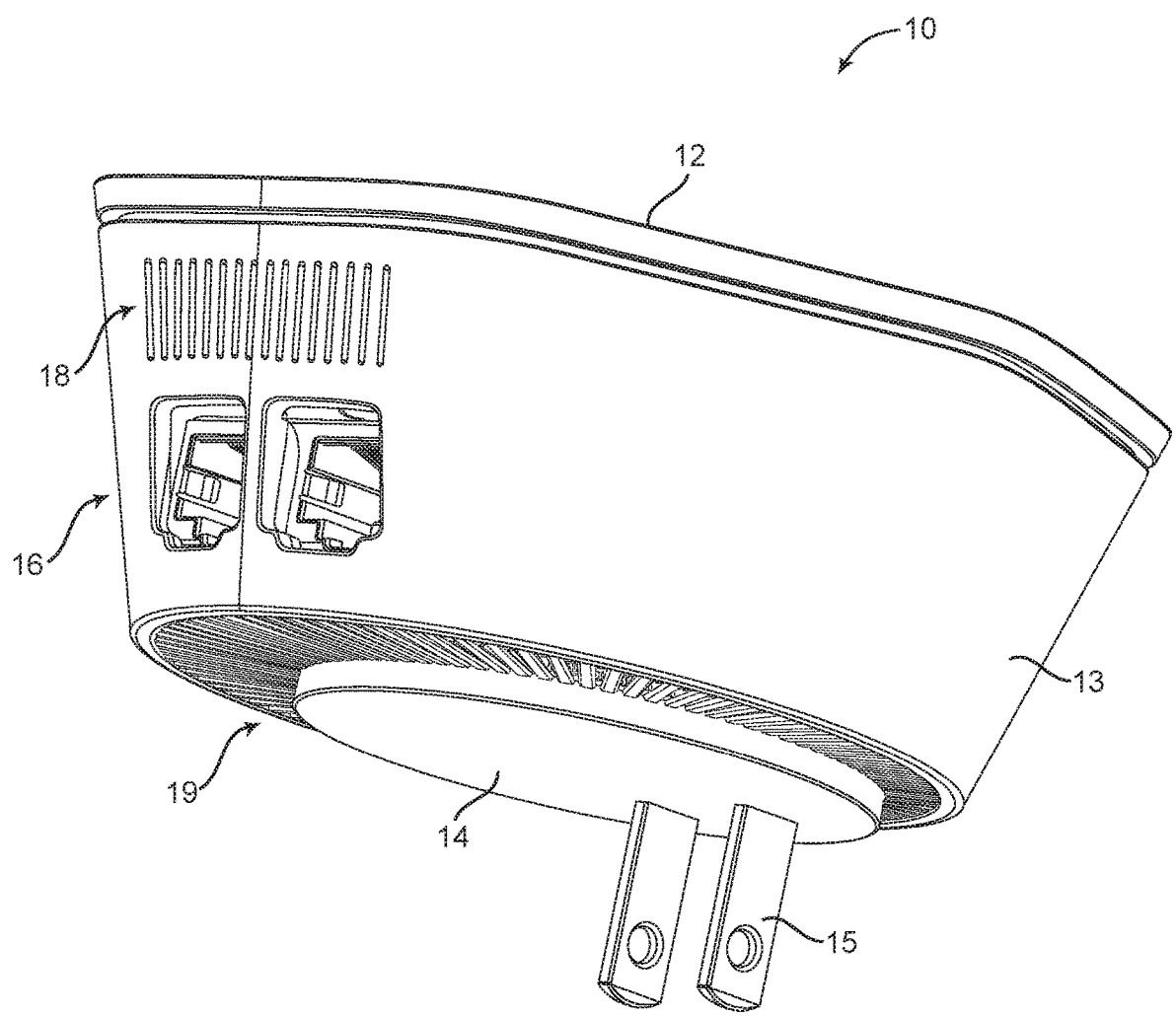
FIG. 1 is a perspective diagram of a compact electronic device.

FIG. 1 is a perspective diagram of a compact electronic device 10. Referring to FIG. 1, the compact electronic device 10 can include a top cover 12 over a base 13. The top cover 12 can be secured to the base 13, such as by snapping (i.e., overlapping material interfaces), and the like.

The base 13 can include a bottom portion 14 and an electrical plug 15 protruding from the bottom portion 14. The base 13 can also include one or more ports 16, such as RJ-45 ports, USB ports, USB Type-C ports, and the like, which enable data connectivity to the compact electronic device 10, e.g., via wires, such as Ethernet, USB, and USB Type-C cables. The base 13 can also include various openings for air intake and/or exhaust for a cooling module 21 (refer to FIG. 3). The openings can include vents 18 located on a side of the base 13, vents 19 located on the bottom portion 14, and various air gaps, such as between the top cover 12 and the base 13, and at the ports 16.

The electrical plug 15 can provide two functions, namely, to connect electrically to a corresponding electrical outlet and to mechanically support the weight of the compact electronic device 10 while plugged into the electrical outlet. The bottom portion 14 can be disposed adjacent to a corresponding structure (e.g., wall), which has the electrical outlet (not shown). Accordingly, the vents 19 can be recessed from the back 14 to allow a gap between the vents 19 and the wall sufficient for airflow.

The base 13 can include a plurality of sides and can have a hexagonal design, i.e., 6 sides. Of course, other embodiments are contemplated.

Figure 2:
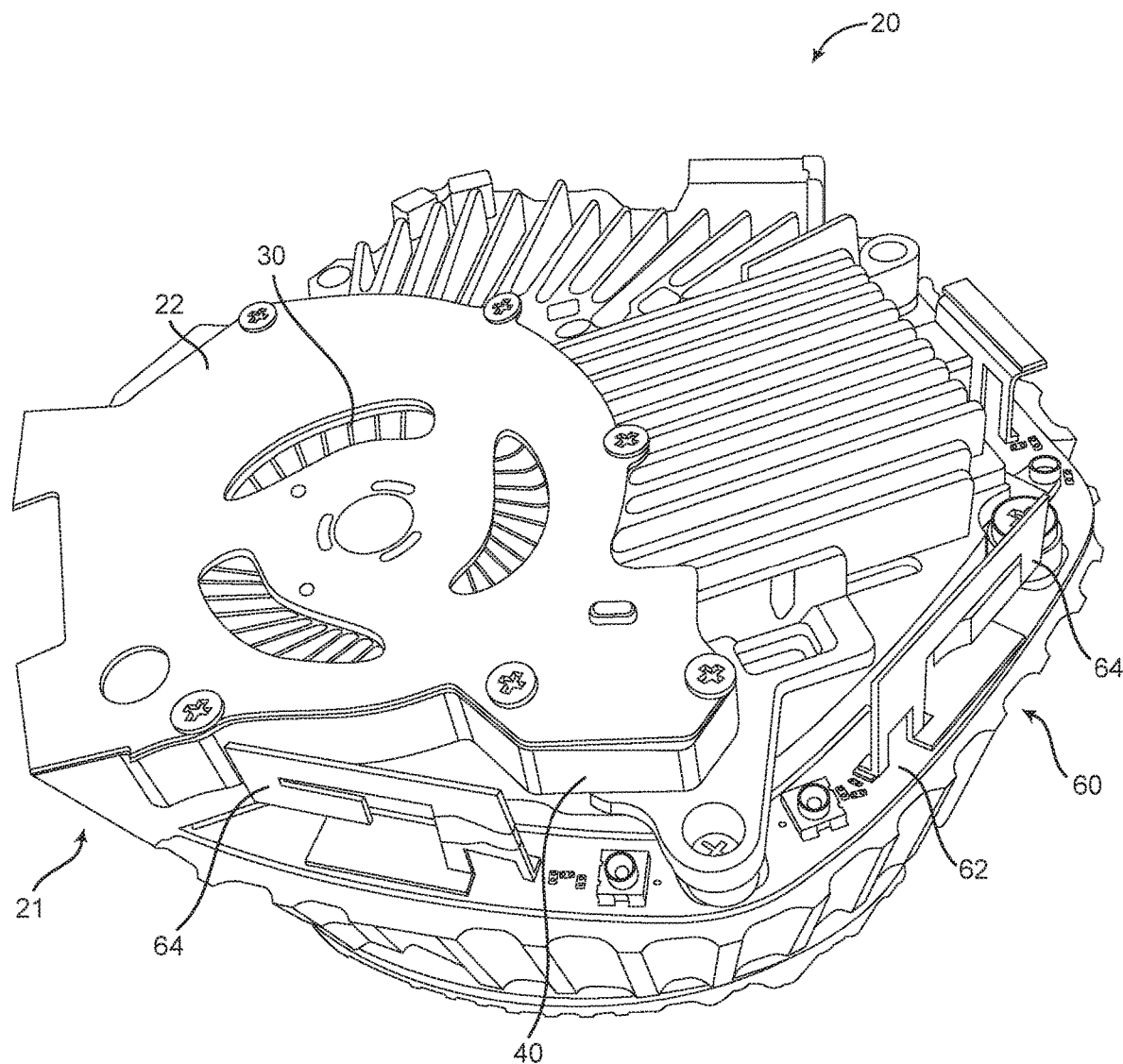
FIG. 2 is a perspective diagram of an internal assembly of interior components of the compact electronic device.
Figure 3:
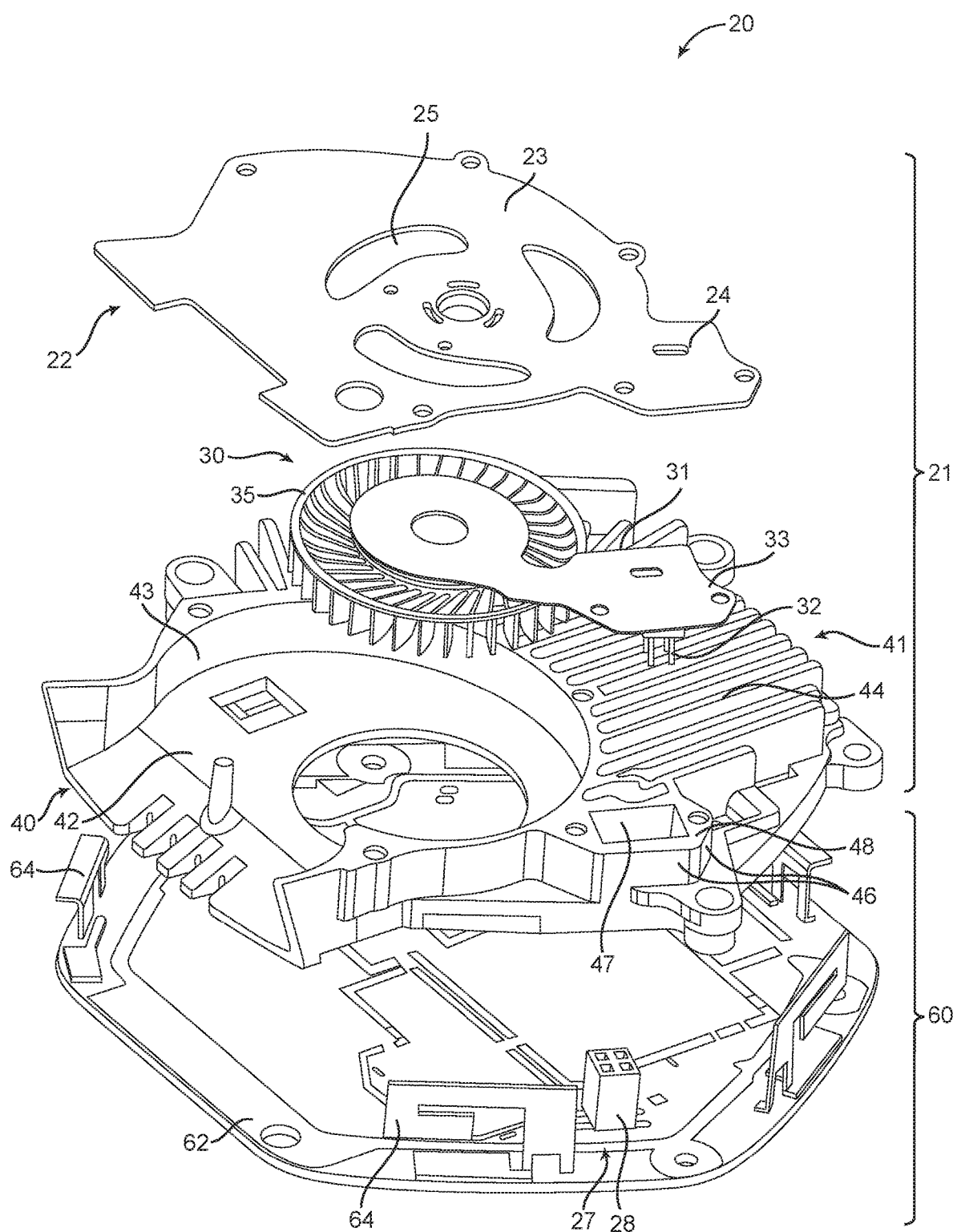
FIG. 3 is a perspective diagram of an exploded view of the internal assembly of FIG. 2.
Figure 4:
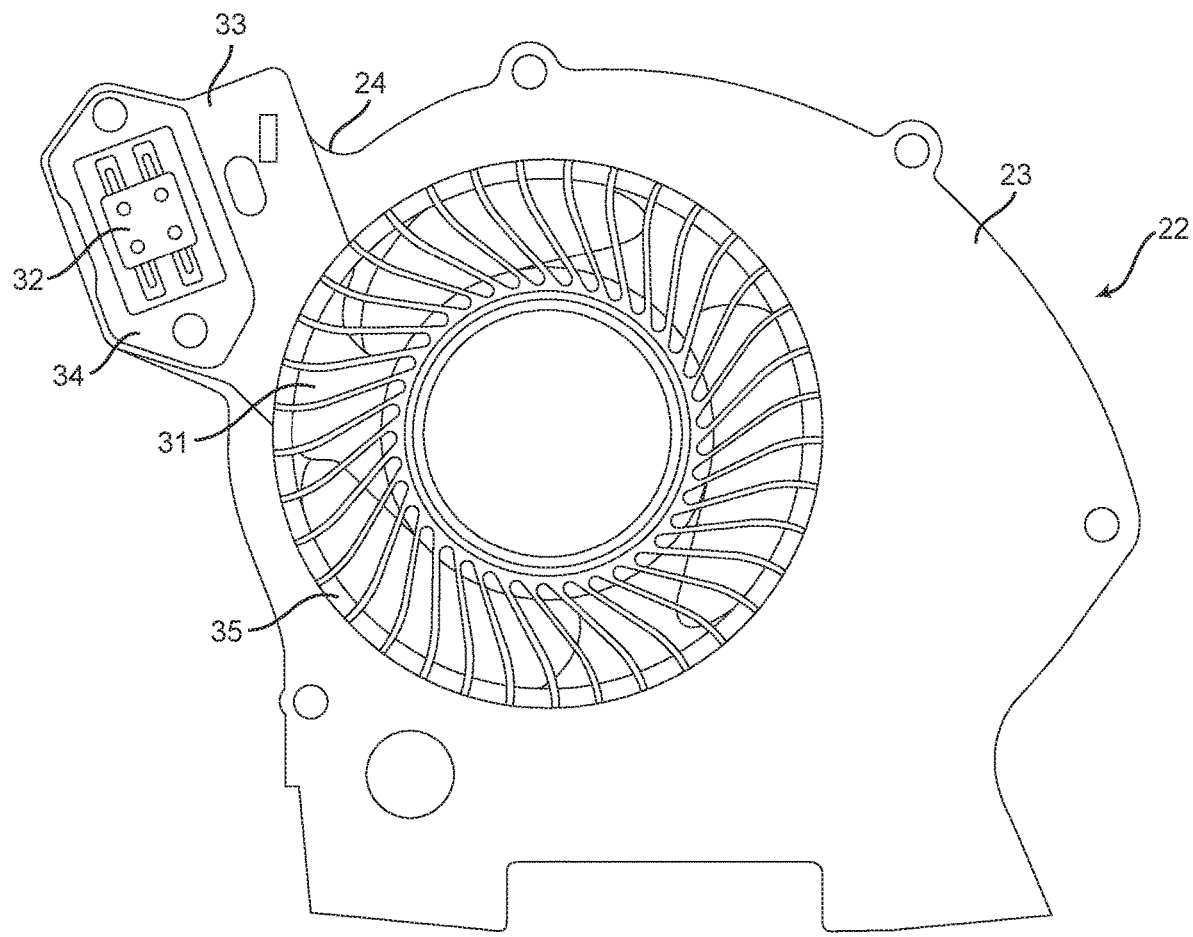
FIG. 4 is a bottom perspective diagram of the fan module and fan carrier of FIGS. 1-3.
Figure 5:
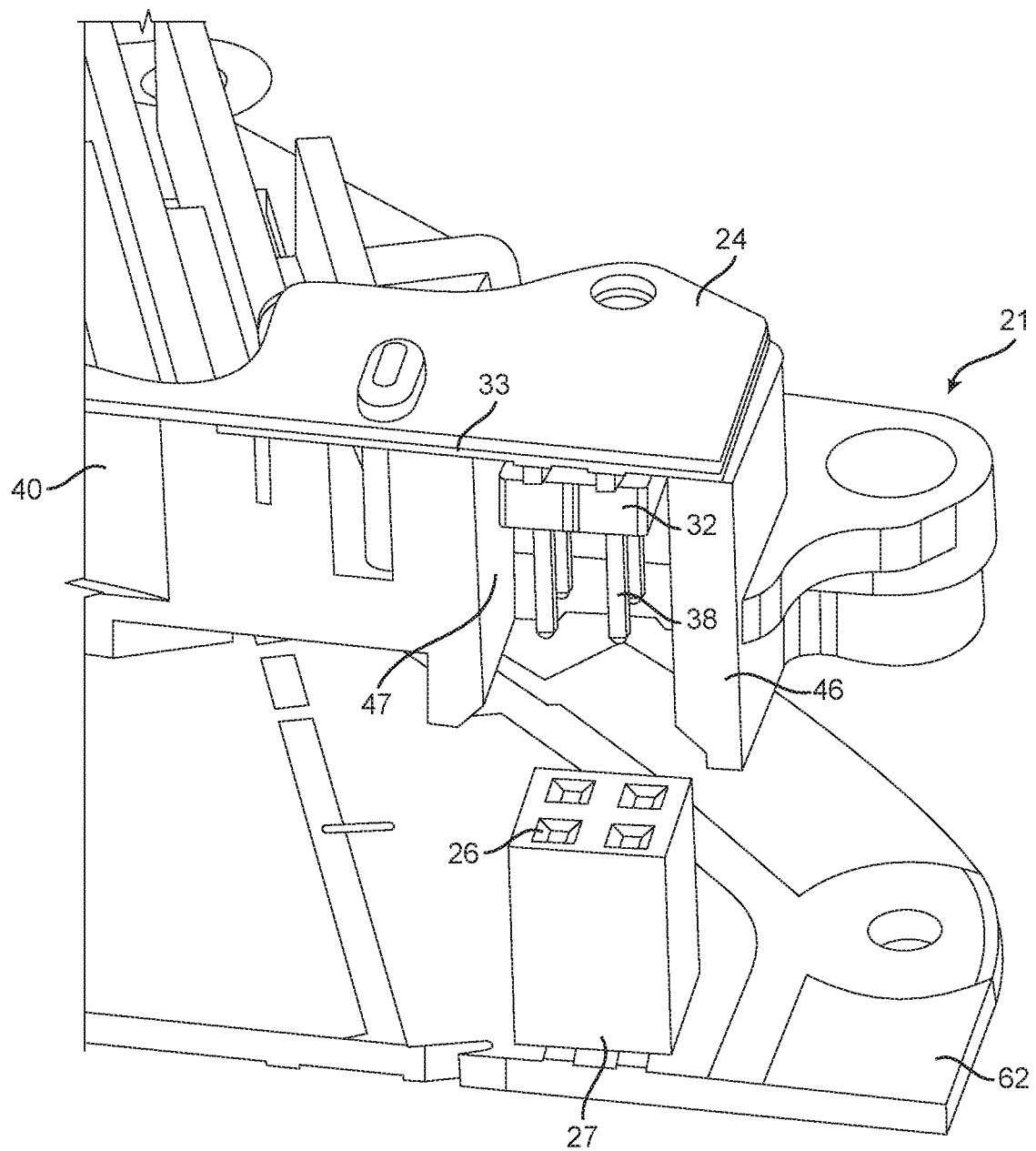
FIG. 5 is a partial perspective cross-sectional diagram of the internal assembly of FIGS. 2-3.

FIG. 2 is a perspective diagram of an internal assembly 20 of interior components of the compact electronic device 10. FIG. 3 is a perspective diagram of an exploded view of the internal assembly 20 of FIG. 2. FIG. 4 is a bottom perspective diagram of the fan module 30 and fan carrier 22 of FIGS. 2-3. FIG. 5 is a partial perspective cross-sectional diagram of the internal assembly 20 of FIGS. 2-3.

Referring to FIGS. 2-5, the compact electronic device 10 can include an internal assembly 20 of components that can be held within a cavity formed by the base 13 and the top cover 12. The internal assembly 20 can include a processing assembly 60 and a cooling assembly 21.

The processing assembly 60 can include a main printed circuit board (PCB) 62. The processing assembly 60 can also include one or more processors, one or more antennas 64, and the like (such as the components described with regards to FIG. 10 below) that are mounted or otherwise connected to the main PCB 62.

The antennas 64 can be part of a tunable antenna system for wireless bands, such as Bluetooth and W-Fi. The antennas 64 can be tunable between single and dual-band, supporting 2.4 GHz operation, 5 GHz operation, and dual simultaneous 2.4 GHz/5 GHz operation. The tuning can be dynamic and electronic, with no physical changes to the antenna 64.

The cooling assembly 21 can be mounted to the main PCB 62, such as by fastening and is configured to cool one or more components of the processing assembly 60. The cooling assembly 21 can include a fan module 30, a fan carrier 22, and a fan mounting shell 40.

The fan module 30 can include a fan PCB 31, a fan 35, and a fan PCB connector 32. The fan PCB 31 can be configured to receive control signals and power for the fan 35 from the main PCB 62. The fan PCB 31 can include a portion 33 that is configured to extend beyond a radial outer boundary of the fan 35.

The fan PCB connector 32 can be joined to the portion 33 and facilitate the electrical connection between the main PCB 62 and the fan PCB 31 via a conductor 27. The fan PCB connector 32 can mate with the conductor 27, such as with an interface that includes one or more prongs/pins 38 and one or more receptacles 26 for receiving the one or more prongs. An opposing end of the conductor 27 can be electrically connected to the main PCB 62. As can be seen in FIG. 3, the conductor 27 can be a main PCB connector that is mounted on the main PCB 62 and that mates with the fan PCB connector 32. The conductor 27 can be connected to the main PCB 62 proximate to at least one of the antennas 64, such as being close enough to the antenna 64 to cause electrical interference in the operation of the antenna 64 or being positioned on a same side of the main PCB 62 as the antenna 64.

Fan connection traces, such as traces for control signals and power supply, can extend along the fan PCB 31 from the fan PCB connector 32 to a connection point of the fan 35. The fan connection traces can be buried within the fan PCB 31 between ground planes of the fan PCB 31 and can be further shielded by metallic portions of the fan carrier 22 and the fan mounting shell 40.

Referring to FIG. 4, the fan PCB 31 can include metallic plating 34 positioned on the portion 33, and that surrounds the fan PCB connector 32. The metallic plating 34 can be a ground track that forms a contiguous ring around the fan PCB connector 32 and can be in contact with a ground plane of the fan PCB 31, such as a ground plane at a bottom of the fan PCB 31.

The fan carrier 22 can include a carrier body 23, a cover portion 24 projecting outward from the carrier body 23, and openings 25 in the carrier body 23 that are configured to allow airflow through the carrier body 23. The fan carrier 22 is configured to assemble to the fan mounting shell 40 with the fan module 30 therebetween and can be configured to support and cover the fan module 30. The fan carrier 22 can also be configured to completely cover a back of the fan PCB 31 with the cover portion 24 being sized to completely cover the portion 33 of the fan PCB 31. The cover portion 24 can be formed of metal and can act as a shield of the ground plane at the back of the fan PCB 31 and as a shield of the fan connection traces in the fan PCB 31.

The fan mounting shell 40 can include a heat sink 41 and cavity walls 46. The heat sink 41 can include fins 44 and a heat sink wall 43. The heat sink wall 43 can define at least part of a fan cavity 42 in the fan mounting shell 40 for receiving the fan 35.

The cavity walls 46 can form a connector cavity 47 that extends through the fan mounting shell 40. The connector cavity 47 is positioned under the portion 33 of the fan PCB 31 and is configured to form a contiguous ring that surrounds the fan PCB connector 32 and the conductor 27 that extends from the fan PCB 31 to the main PCB 62. The cavity walls 46 can define a mating surface 48 that is configured to contact and mate with the metallic plating 34 and can be configured to create an electrical seal of the fan PCB connector 32 and the conductor 27. The mating surface 48 can form a contiguous ring around the connector cavity 47. The cavity walls 46 can be formed of a metallic material and can be part of or separate from the heat sink 41. The cavity walls 46 can be positioned adjacent to the fins 44 of the heat sink 41.

Similar to the metallic plating 34, the main PCB 62 can include ground tracks 66 that match an outline of the connector cavity 47/align with the cavity walls 46 or otherwise surround the cavity while contacting the fan mounting shell 40, which can be configured to encapsulate and create an electrical seal of the fan PCB connector 32 and the conductor 27. The metallic plating 34 and ground tracks 66 can be a corrosion resistant high connectivity malleable material, such as gold plating. The metallic plating 34 and ground tracks 66 can also be a conductive gasket positioned between the fan mounting shell 40 and the respective PCBs. The metallic plating 34 and the ground tracks 66 can be positioned to electrically connect with portions of a ground plane of the respective PCBs that is exposed to an outer surface of the respective PCBs.

Figure 6:
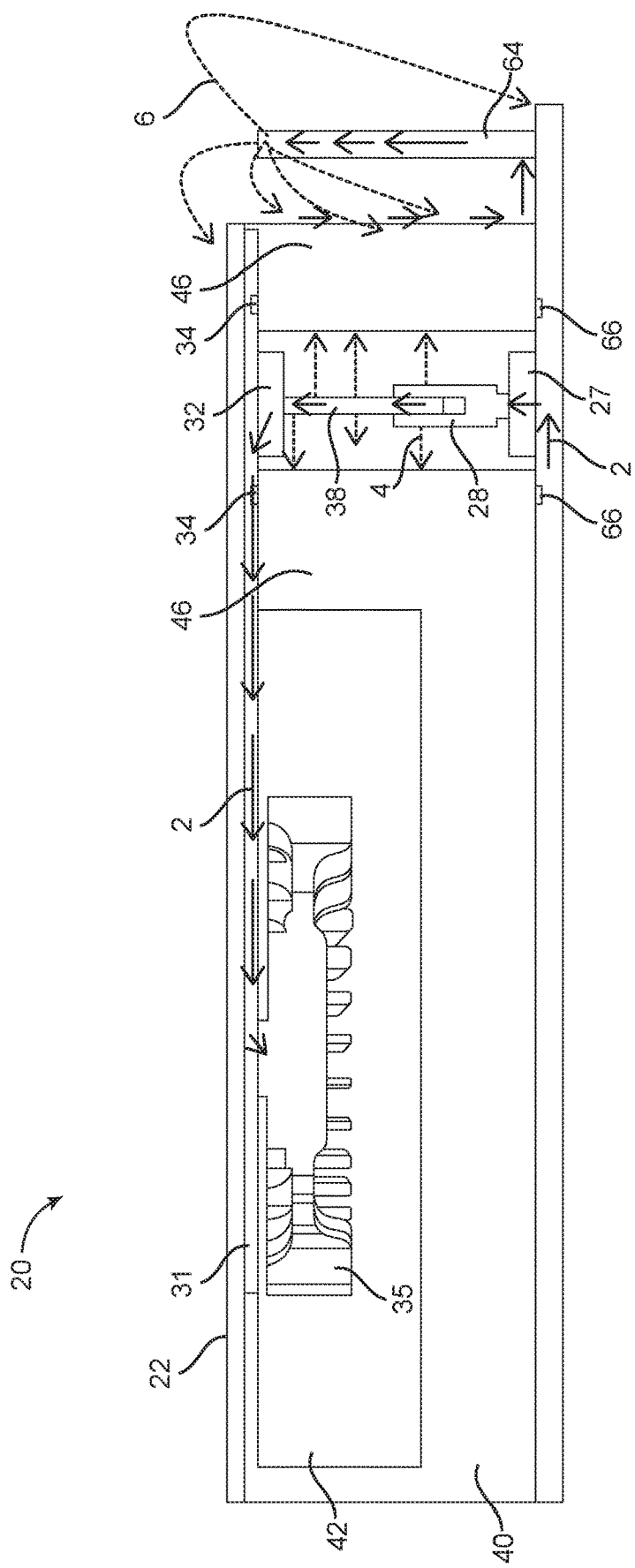
FIG. 6 is a perspective cross-sectional diagram of the internal assembly of FIGS. 2-3.

FIG. 6 is a perspective cross-sectional diagram of the internal assembly 20 of FIGS. 2-3. The combination of the ground planes, the metallic plating 34, the ground tracks 66, and the fan mounting shell 40, including the cavity walls 46, can form a Faraday cage and can shield and isolate the antennas 64 from the currents flowing through and electric fields produced by the conductor 27, such as the connector 28 shown in FIG. 6, and fan PCB connector 32, such as the pin 38 shown in FIG. 6.

Referring to FIG. 6, the current/control signals 2 can flow from the main PCB 62, across the conductor 27 and fan PCB connector 32 to the fan PCB 31, and along the fan PCB 31 to the fan 35. The current/control signals 2 flowing along the PCBs can be shielded by the ground planes of the PCBs. As illustrated in FIG. 6, the electric fields 4 resulting from the current/control signals 2 traveling across the conductor 27 and fan PCB connector 32 can be shielded by the combination of the ground planes, the metallic plating 34, the ground tracks 66, and the fan mounting shell 40 including the cavity walls 46. As such, interference with the electric fields 6 of the antennas 64 by the electric fields 4 can be reduced or prevented.

Figure 7:
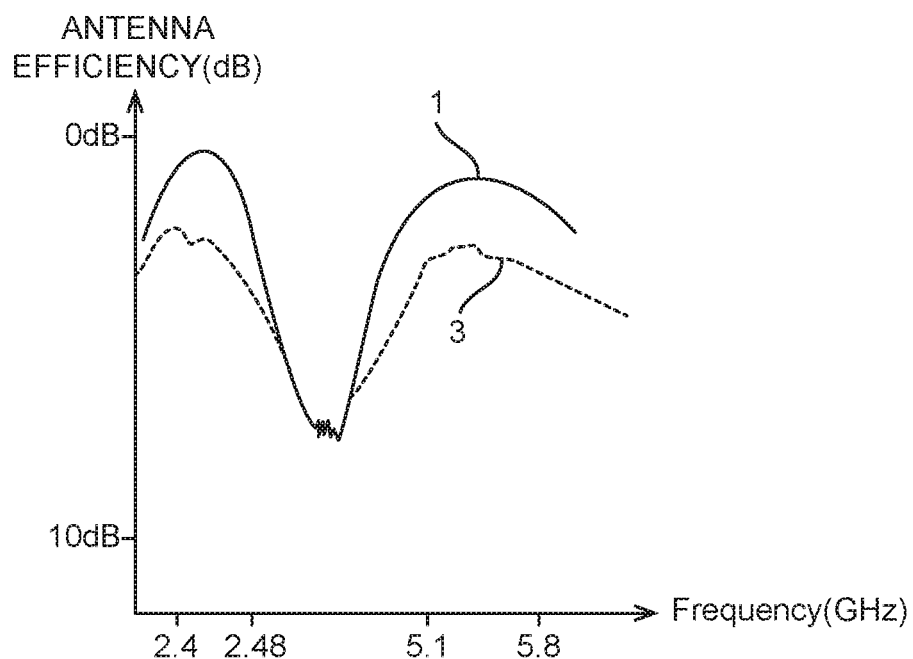
FIG. 7 is a graph which illustrates the efficiency versus frequency of the antennas.

FIG. 7 is a graph which illustrates the efficiency versus frequency when operating the antennas 64 with the current/control signals 2 shielded as described herein (labeled 1) in contrast with the efficiency versus frequency when operating the antennas 64 with the current/control signals 2 not shielded (labeled 3). As can be seen in FIG. 7, when shielding the current/control signals 2 as described herein, the efficiency 1 of the antennas 64 is recuperated and not degraded as the efficiency 3 is when not shielding the current/control signals 2 since the conductor 27 and the fan PCB connector 32 can potentially act as a parasitic that absorbs radiating power from the antennas 64.

Figure 8:
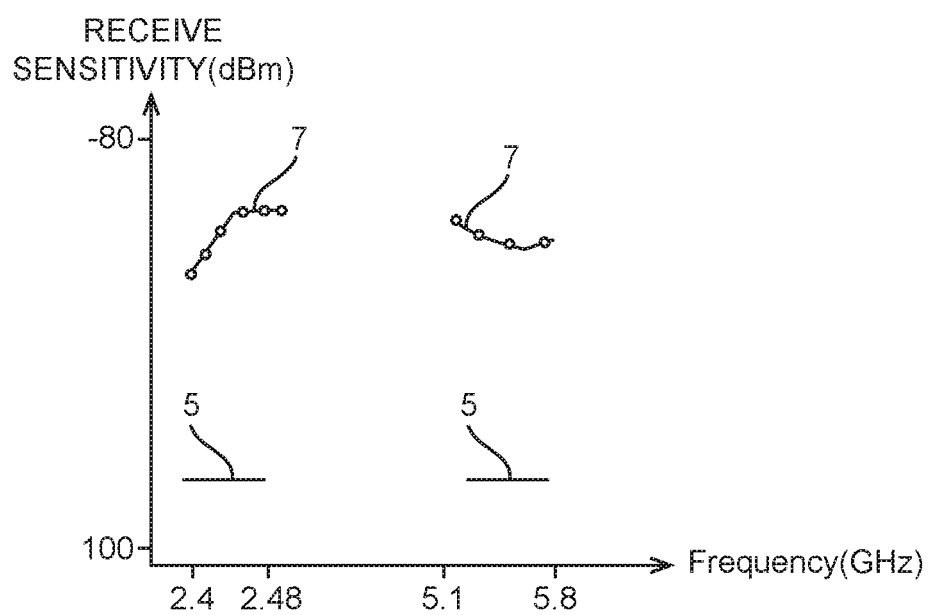
FIG. 8 is a graph which illustrates the receive sensitivity versus frequency of the antennas.

FIG. 8 is a graph which illustrates the receive sensitivity versus frequency when operating the antennas 64 with the current/control signals 2 shielded as described herein (labeled 5) in contrast with the receive sensitivity versus frequency when operating the antennas 64 with the current/control signals 2 not shielded (labeled 7). As can be seen in FIG. 8, when shielding the current/control signals 2 as described herein, the receive sensitivity 5 of the antennas 64 is recuperated and not degraded as the receive sensitivity 7 is when not shielding the current/control signals 2 since the current/control signals 2, conductor 27, connector 28, the fan PCB connector 32, and pins 38, can potentially act as parasitics that absorb radiating power from the antennas 64 an can themselves, or their intermodulations, inject power into an antenna 64 and desensitize the antenna 64.

Figure 9:
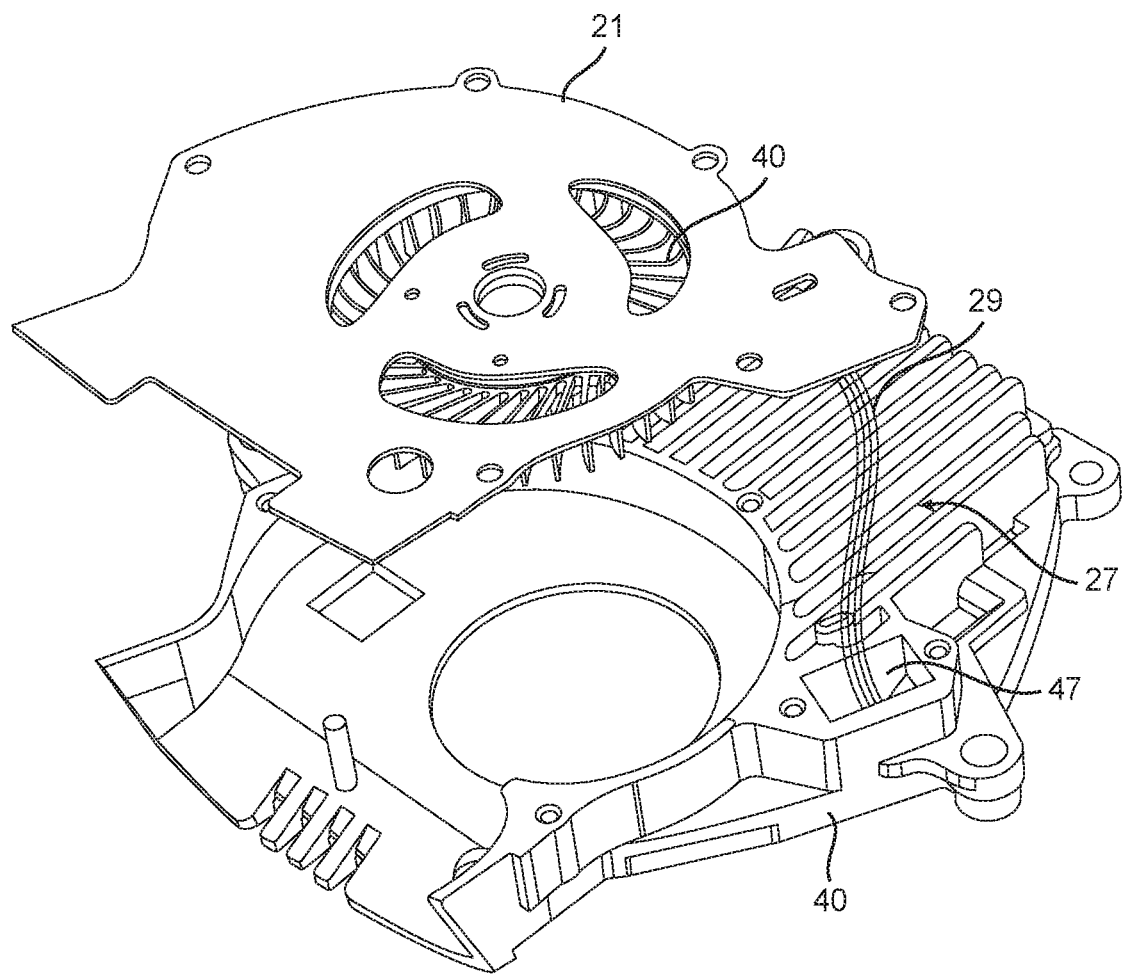
FIG. 9 is a perspective partially exploded view of the cooling assembly.

FIG. 9 is a perspective partially exploded view of the cooling assembly 21. As can be seen in FIG. 9, the conductor 27 can include wires 29 extending between the main PCB 62 and the fan PCB 31, such as from the fan PCB connector 32 and a main PCB connector. The connector cavity 47 can be sized to receive any slack required for assembling the internal assembly 20.

Figure 10:
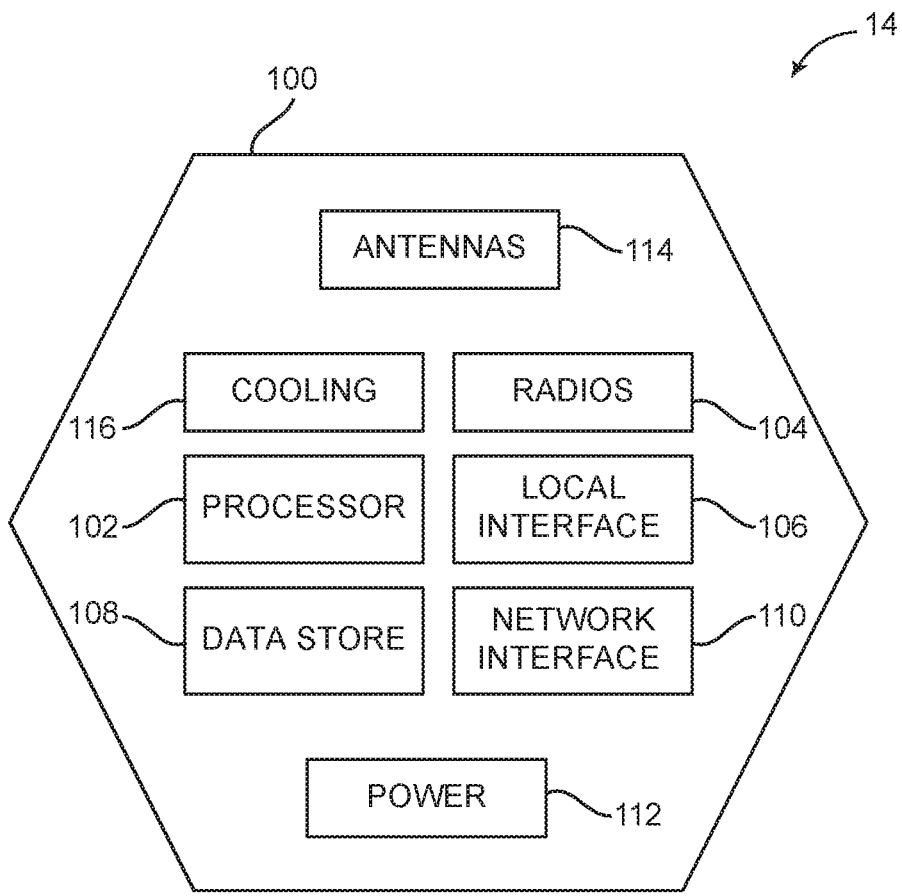
FIG. 10 is a block diagram of functional components of the compact electronic device configured as a wireless access point.

FIG. 10 is a block diagram of functional components of the processing module 60 of the compact electronic device 10 configured as a wireless access point. The access point includes a physical form factor 100 as described herein, which can contain a processor 102, a plurality of radios 104, a local interface 106, a data store 108, a network interface 110, power 112, antennas 114, and cooling 116. It should be appreciated by those of ordinary skill in the art that FIG. 10 depicts the access point in an oversimplified manner, and a practical embodiment may include additional components and suitably configured processing logic to support features described herein or known or conventional operating features that are not described in detail herein.

In an embodiment, the form factor 100 is a compact physical implementation where the access point directly plugs into an electrical outlet and is physically supported by the electrical plug connected to the electrical outlet. This compact physical implementation is ideal for a large number of access points distributed throughout a residence. The processor 102 is a hardware device for executing software instructions. The processor 102 can be any custom made or commercially available processor, a central processing unit (CPU), an auxiliary processor among several processors, a semiconductor-based microprocessor (in the form of a microchip or chipset), or generally any device for executing software instructions. When the access point is in operation, the processor 102 is configured to execute software stored within memory or the data store 108, to communicate data to and from the memory or the data store 108, and to generally control operations of the access point pursuant to the software instructions. In an embodiment, the processor 102 may include a mobile optimized processor such as optimized for power consumption and mobile applications.

The radios 104 enable wireless communication. The radios 104 can operate according to the IEEE 802.11 standard. The radios 104 include address, control, and/or data connections to enable appropriate communications on a Wi-Fi system via the antennas 114. The access point can include a plurality of radios to support different links, i.e., backhaul links and client links. In an embodiment, the access points support dual-band operation simultaneously operating 2.4 GHz and 5 GHz 2×2 MIMO 802.11 b/g/n/ac radios having operating bandwidths of 20/40 MHz for 2.4 GHz and 20/40/80 MHz for 5 GHz. For example, the access points can support IEEE 802.11 AC1200 gigabit Wi-Fi (180+867 Mbps). The antennas 114 can include one or more of the antennas 64 described above.

The local interface 106 is configured for local communication to the access point and can be either a wired connection or wireless connection such as Bluetooth or the like. The data store 108 is used to store data. The data store 108 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 108 may incorporate electronic, magnetic, optical, and/or other types of storage media.

The network interface 110 provides wired connectivity to the access point. For example, the network interface 110 can include the one or more ports 16. The network interface 110 may be used to enable the access point to communicate to a modem/router. Also, the network interface 110 can be used to provide local connectivity to a Wi-Fi client device. For example, wiring in a device to an access point can provide network access to a device that does not support Wi-Fi. The network interface 110 may include, for example, an Ethernet card or adapter (e.g., 10BaseT, Fast Ethernet, Gigabit Ethernet, 10 GbE). The network interface 110 may include address, control, and/or data connections to enable appropriate communications on the network.

The processor 102 and the data store 108 can include software and/or firmware which essentially controls the operation of the access point, data gathering and measurement control, data management, memory management, and communication and control interfaces with a server via the cloud. The processor 102 and the data store 108 may be configured to implement the various processes, algorithms, methods, techniques, etc. described herein. For example, the processor 102 can be communicatively coupled to the fan PCB 32 via the electrical conductors 36.

The cooling 116 can include the cooling module 21 described in detail above.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A compact electronic device for wireless communication, comprising:
   a main printed circuit board;
   one or more antennas configured for wireless communication;
   a fan printed circuit board;
   a fan connected to the fan printed circuit board and to at least one conductor by way of a connector configured to provide at least one of control signals and power to the fan;
   a metallic plating electrically connected to a ground plane of the fan printed circuit board, the metallic plating forming a contiguous ring around a connection between the at least one conductor and the fan printed circuit board; and
   a shell disposed on the main printed circuit board configured to mount the fan relative to the main printed circuit board, the shell comprising walls forming a cavity, the walls encapsulating the at least one conductor in the cavity and the connection between the at least one conductor and the fan printed circuit board, and the contiguous ring contacting a mating surface of the walls to shield the one or more antennas from the conductor and the connection.

2. The compact electronic wireless device of claim 1, wherein the walls are electrically connected to a ground on the fan printed circuit board and to a ground on the main printed circuit board.

3. The compact electronic device of claim 1, wherein connection traces in the fan printed circuit board are shielded by a ground plane at a back of the fan printed circuit board.

4. The compact electronic device of claim 1, wherein connection traces in the fan printed circuit board and in the main printed circuit board are each positioned between ground planes within the fan printed circuit board and the main printed circuit board respectively.

5. The compact electronic device of claim 1, wherein the metallic plating is a conductive gasket positioned between the fan printed circuit board and the shell.

6. The compact electronic device of claim 1, wherein the main printed circuit board comprises ground tracks forming another contiguous ring around the conductor at a connection of the conductor to the main printed circuit board, the ground tracks contacting a bottom of the shell to shield the one or more antennas from the conductor and the connection of the conductor to the main printed circuit board.

7. The compact electronic device of claim 1, wherein the shell comprises a heat sink, and the cavity adjoins fins of the heat sink.

8. The compact electronic device of claim 1, wherein the walls form a contiguous ring around the conductor.

9. The compact electronic device of claim 1, wherein the conductor comprises a main printed circuit board connector fixed to the main printed circuit board, and the conductor is configured to mate with the fan printed circuit board connector.

10. The compact electronic device of claim 1, wherein the conductor comprises one or more wires encapsulated within the cavity.

11. The compact electronic device of claim 10, wherein the cavity being sized to receive slack in the one or more wires required for assembly of the compact electronic device.

12. The compact electronic device of claim 10, wherein the wires connect to the main printed circuit board via the connector, the connector being encompassed in the cavity and be surrounded by the walls.

13. The compact electronic device of claim 12, wherein the connector is surrounded by another contiguous ring of ground on the main printed circuit board which contacts the shell.

14. The compact electronic device of claim 1, further comprising a fan carrier that holds the fan in place relative to the shell, the fan carrier covering a back of the fan printed circuit board to shield connection traces in the fan printed circuit board and to shield the cavity.

15. A wireless access point, comprising:
a main printed circuit board;
one or more antennas configured for wireless communication;
a fan module comprising a fan and a fan printed circuit board configured to provide control signals and power to the fan;
at least one conductor by the way of a connector connected to the fan printed circuit board and configured to provide at least one of control signals and power to the fan, the conductor being connected to the main printed circuit board proximate to at least one antenna;
a metallic plating electrically connected to a ground plane of the fan printed circuit board, the metallic plating forming a contiguous ring around a connection between the at least one conductor and the fan printed circuit board: and
a shell disposed on the main printed circuit board mounting the fan module relative to the main printed circuit board, the shell comprising walls forming a cavity, the walls encapsulating the conductor in the cavity and the connection between the at least one conductor and the fan printed circuit board, and the contiguous ring contacting a mating surface of the walls to shield the one or more antennas from the conductor and the connection.

16. The wireless access point of claim 15, wherein, the main printed circuit board comprises ground tracks forming a contiguous ring around the conductor at a connection of the conductor to the main printed circuit board, the ground tracks contacting a bottom of the shell to shield the one or more antennas from the conductor and the connections of the conductor to the fan printed circuit board and the main printed circuit board.

17. A method of providing a compact electronic wireless device, comprising:
providing a main printed circuit board and one or more antennas configured for wireless communication;
providing a fan connected to a fan printed circuit board and the fan connected to at least one conductor by way of a connector configured to provide at least one of a control signals and power to the fan;
providing a metallic plating electrically connected to a ground plane of the fan printed circuit board, the metallic plating forming a contiguous ring around a connection between the at least one conductor and the fan printed circuit board;
providing a shell disposed on the main printed circuit board configured to mount the fan relative to the main printed circuit board, the shell comprising walls forming a cavity and the walls encapsulating the at least one conductor in the cavity and the connection between the at least one conductor and the fan printed circuit board, and the contiguous ring contacting a mating surface of the walls to shield the one or more antennas from the conductor and the connection; and
encapsulating the conductor in the cavity within the walls of the shell.

18. The method of claim 17, further comprising electrically connecting the walls of the shell to a ground on a fan printed circuit board and to a ground on the main printed circuit board.

* * * * *